(12) United States Patent
Ogawa et al.

(10) Patent No.: US 8,004,903 B2
(45) Date of Patent: *Aug. 23, 2011

(54) SEMICONDUCTOR MEMORY DEVICE

(75) Inventors: Mikio Ogawa, Yokohama (JP); Norihiro Fujita, Yokohama (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/723,057

(22) Filed: Mar. 12, 2010

(65) Prior Publication Data

US 2010/0165744 A1    Jul. 1, 2010

Related U.S. Application Data (60) Continuation of application No. 12/339,153, filed on Dec. 19, 2008, now Pat. No. 7,701,777, which is a division of application No. 11/194,608, filed on Aug. 2, 2005, now Pat. No. 7,486,562.

(30) Foreign Application Priority Data

Aug. 13, 2004   (JP) ................................ 2004-235886
Jul. 7, 2005   (JP) ................................ 2005-199055

(51) Int. Cl.
   *G11C 11/34* (2006.01)
(52) U.S. Cl. ................................ 365/185.21
(58) Field of Classification Search ............... 365/185.21
   See application file for complete search history.

(56) References Cited

U.S. PATENT DOCUMENTS

| | | | |
|---|---|---|---|
| 6,097,638 A | 8/2000 | Himeno et al. | |
| 6,982,904 B2 * | 1/2006 | Shiga | ........................ 365/185.09 |
| 7,023,736 B2 | 4/2006 | Cernea et al. | |

FOREIGN PATENT DOCUMENTS

| | | |
|---|---|---|
| JP | 08-077787 | 3/1996 |
| JP | 10-228792 | 8/1998 |
| JP | 11-167800 | 6/1999 |
| JP | 2000-76882 | 3/2000 |
| WO | WO 2004/029975 | 4/2004 |

\* cited by examiner

*Primary Examiner* — Hoai V. Ho
*Assistant Examiner* — Anthan T Tran
(74) *Attorney, Agent, or Firm* — Oblon, Spivak, McClelland, Maier & Neustadt, L.L.P.

(57) ABSTRACT

A semiconductor memory device includes a memory cell array and a sense amp circuit. The memory cell array includes bit lines connected to memory cells operative to store first logic data and second logic data smaller in cell current than the first logic. The sense amp circuit has a clamp transistor operative to clamp a bit line voltage. The sense amp circuit is operative to detect data in a selected memory cell via the clamp transistor and the bit line. The sense amp circuit is operative to read data from the selected memory cell in at least the two of first and second read cycles while a control voltage is applied to a gate of the clamp transistor. Different control voltages are applied to the gate of the clamp transistor in the first and second read cycles.

4 Claims, 10 Drawing Sheets

SEMICONDUCTOR MEMORY DEVICE

CROSS-REFERENCE TO RELATED APPLICATIONS

The present continuation application claims the benefit of priority under 35 U.S.C. 120 to application Ser. No. 12/339,153, filed on Dec. 19, 2008 which claims the benefit of priority under 35 U.S.C. §120 to application Ser. No. 11/194,608, filed Aug. 2, 2005, and claims the benefit of priority under 35 U.S.C. §119 from Japanese Patent Application Nos. 2004-235886, filed on Aug. 13, 2004, and 2005-199055, filed on Jul. 7, 2005, the entire content of each of which are hereby incorporated herein by reference.

BACKGROUND OF THE INVENTION

1. Field of the Invention

The present invention relates to a semiconductor memory device and more particularly to an improved sense amp circuit.

2. Description of the Related Art

A sense amp circuit in a semiconductor memory such as a flash memory fundamentally detects the presence/absence or large/small of cell current flowing based on data in a memory cell to determine the data. The sense amp circuit is generally connected to data lines (bit lines), which are connected to a plurality of memory cells. The sense amp circuit is roughly classified by the sense scheme into a voltage detection type and a current detection type.

The sense amp circuit of the voltage detection type precharges a bit line isolated from memory cells up to a certain voltage, then discharges the bit line through a selected memory cell, and detects the discharged state of the bit line at a sense node connected to the bit line. At the time of data sensing, the bit line is isolated from a current path load to detect a bit line voltage determined from cell data. An NAND-type flash memory usually employs this sense amp scheme (see JP-A 2000-076882, for example).

The sense amp circuit of the current detection type tries for data sense to feed read current in a memory cell via a bit line. Also in this case, however, cell data determines the bit line voltage and finally data determination at a sense node connected to the bit line leads to detection of a difference in voltage based on the difference in cell current (see JP-A 10-228792, for example).

The sense amp circuit of the voltage detection type and the sense amp circuit of the current detection type generally have the following advantages and disadvantages. The voltage detection type utilizes bit line charge and discharge and accordingly requires less power consumption. To the contrary, in a mass-storage memory with a large bit line capacitance, it requires a long charge and discharge time, which makes high-speed sense difficult. In addition, the bit line voltage has relatively large amplitude in accordance with the cell data, which causes a problem associated with noises between adjacent bit lines.

The sense amp circuit of the current detection type in contrast is capable of high-speed sensing by feeding read current in a memory cell via a bit line for data sense. In addition, a clamp transistor (pre-sense amp) is located between the bit line and the sense node to reduce the amplitude of the bit line voltage depending on the cell data and accordingly have a strength against noises between the bit lines. Achievement of these advantages, however, increases power consumption.

Mass-storage NAND-type flash memories have widely employed the sense amp circuit of the voltage detection type. If the storage capacity is increased progressively, however, achievement of high-speed sense with suppressed power consumption becomes a critical subject to be solved.

SUMMARY OF THE INVENTION

A first aspect of the invention provides a semiconductor memory device, comprising: a memory cell array including bit lines connected to memory cells operative to store first logic data and second logic data smaller in cell current than the first logic data; and a sense amp circuit having a clamp transistor operative to clamp a bit line voltage, the sense amp circuit being operative to detect data in a selected memory cell via the clamp transistor and the bit line, wherein the sense amp circuit is operative to read data from the selected memory cell in at least the two of first and second read cycles while a control voltage is applied to a gate of the clamp transistor, and wherein different control voltages are applied to the gate of the clamp transistor in the first and second read cycles.

A second aspect of the invention provides a semiconductor memory device, comprising: a memory cell array including bit lines connected to memory cells operative to store first logic data and second logic data smaller in cell current than said first logic data; and a sense amp circuit connected to said bit line to detect data in said memory cell, wherein said sense amp circuit includes a sense node connected via a first switching element to a current source load, a sense PMOS transistor having a gate connected to said sense node and a source connected via a second switching element to a power source terminal, a data latch connected to a drain of said sense PMOS transistor, a clamp NMOS transistor connected between said current source load and said bit line via a current limit NMOS transistor to clamp a bit line voltage and amplify said bit line voltage to transmit it to said sense node, and a third switching element serially connected to said current source load and on/off-controlled in response to data held in said data latch.

A third aspect of the invention provides a semiconductor memory device, comprising a memory cell array including bit lines connected to memory cells operative to store first logic data and second logic data smaller in cell current than said first logic data; and a sense amp circuit having a clamp transistor operative to clamp a bit line voltage, said sense amp circuit being operative to detect data in a selected memory cell via said clamp transistor and said bit line, wherein said sense amp circuit includes a sense node connected via at least said clamp transistor to said bit line, a first switching element operative to switch supply of current to charge said sense node, a sense PMOS transistor having a gate connected to said sense node and a source to be given a supply voltage, a second switching element operative to switch application of a supply voltage to a source of said sense PMOS transistor, and a data latch connected to a drain of said sense PMOS transistor, wherein said sense amp circuit is configured to read data from a selected memory cell during at least the two of a first read cycle and a second read cycle to be executed after said first read cycle, wherein said second switching element starts application of said supply voltage in said first read cycle when a first time period elapses after said first switching element halts supply of current, wherein said second switching element starts application of said supply voltage in said second read cycle when a second time period elapses after said first switching element halts supply of current, and wherein said first time period is longer than said second time period.

DETAILED DESCRIPTION OF THE INVENTION

Embodiments of the invention will now be described below with reference to the drawings.

Figure 1:
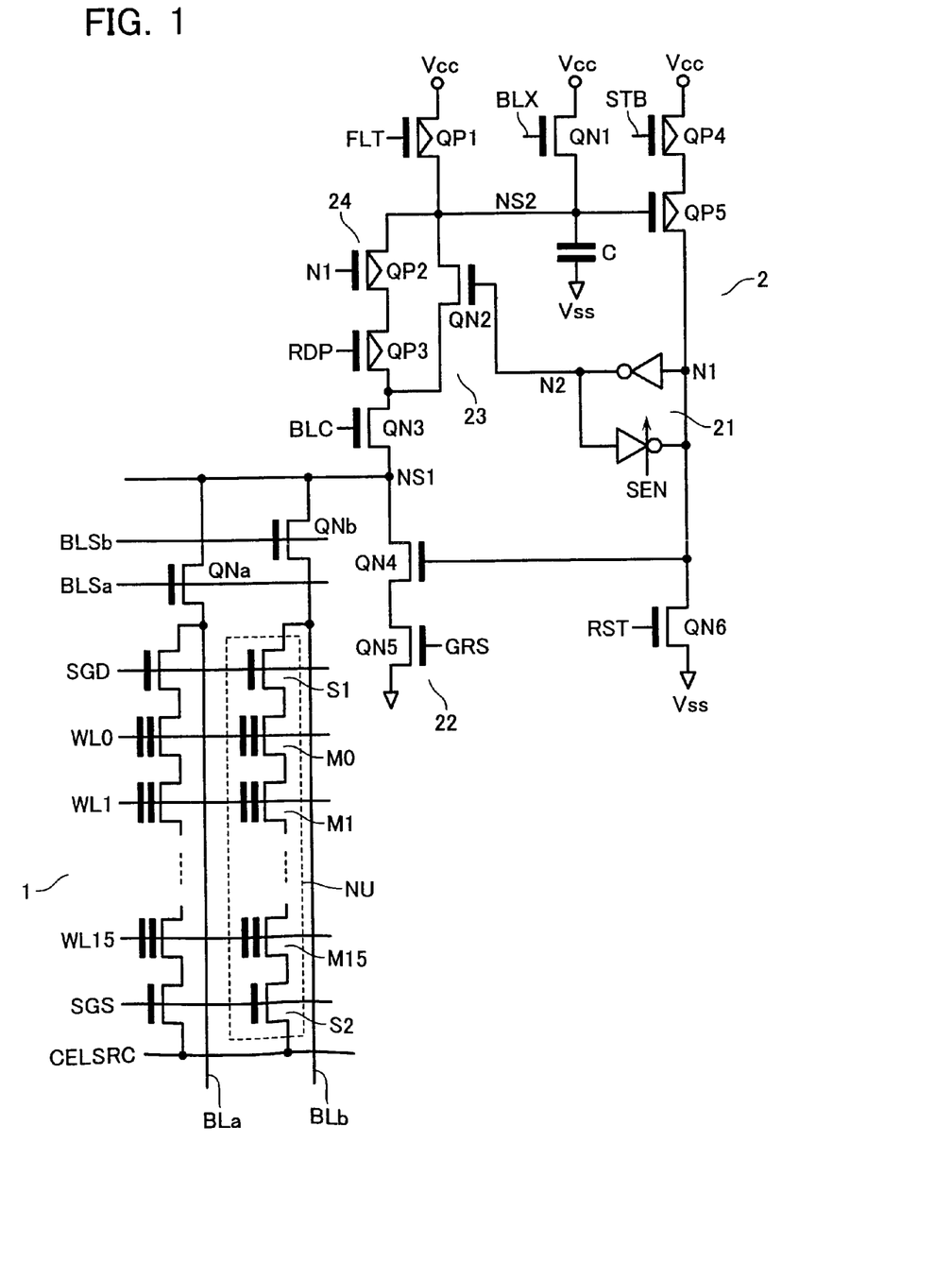
FIG. 1 shows a configuration of a memory cell array and a sense amp circuit in a flash memory according to an embodiment of the invention.

FIG. 1 shows a configuration of a memory cell array 1 and a sense amp circuit 2 in an NAND-type flash memory according to an embodiment.

The memory cell array 1 comprises an array of NAND cell units NU though a portion associated with two adjacent bit lines BLa and BLb is shown in the figure. An NAND cell unit NU includes a plurality (16 in this example) of serially connected electrically erasable programmable non-volatile memory cells M0-M15. This memory cell train has one end connected to the bit lines BLa, BLb via a selection gate transistor S1 and the other end connected to a common source line CELSRC via a selection gate transistor S2.

The memory cells M0-M15 have respective control gates connected to different word lines WL0-WL15. The selection gate transistors S1, S2 have respective gates connected to selection gate lines SGD, SGS extending in parallel with the word lines.

The sense amp circuit 2 is shared between two adjacent bit lines BLa, BLb. In a word, the bit lines BLa, BLb are selectively connected to a first sense node NS1 via bit line selection transistors QNa, QNb. The first sense node NS1 is connected to a second sense node NS2 via a bit line voltage clamp and pre-sense NMOS transistor QN3 and via transfer circuits 23, 24. The second sense node NS2 is connected to a charge holding capacitor C.

The transfer circuits 23, 24 connected between the second sense node NS2 and the clamp NMOS transistor QN3 is operative to select connection/disconnection between them on the basis of operation modes. The one transfer circuit 23 is employed on data reading. It includes an NMOS transistor QN2 having a gate controlled from a data node N2 of a data latch 21. The other transfer circuit 24 is employed on data writing (programming). It includes a serially connected circuit of a PMOS transistor QP2 having a gate controlled from a data node N1 of the data latch 21 and a PMOS transistor QP3 having a gate controlled by a control signal RDP.

On reading, the control signal RDP is made "H" to turn off the transfer circuit 24. Accordingly, read current is supplied to a selected memory cell via the transfer circuit 22 and via the clamp transistor QN3. A variation in bit line voltage is transmitted through the transfer circuit 23 to the sense node NS2 while it is amplified at the clamp transistor QN3. On data writing, it is required to transfer Vcc to a bit line for "1" write. Therefore, together with the transfer circuit 23, the transfer circuit 24 is employed because it includes PMOS transistors QP2, QP3 that exhibit no voltage drop.

A PMOS transistor QP5 having a gate connected to the second sense node NS2 serves as a sense transistor. The sense transistor QP5 has a source connected to a power supply Vcc via a switching PMOS transistor QP4 operative to turn on at the time of data sense and a drain connected to the data node N1 of the data latch 21 operative to hold data.

The data latch 21 is connected to a reset NMOS transistor QN6 to reset the data node N1 to "L" level prior to a read cycle.

The sense node NS2 is connected to the two of a current source PMOS transistor QP1 and a current source NMOS transistor QN1 serving as current source loads to supply read current. The PMOS transistor QP1 is employed to charge the sense node NS2 up to the supply voltage Vcc for a certain time period after the beginning of read to supply read current to a memory cell through a selected bit line. The NMOS transistor QN1 feeds load current required for voltage amplification at the clamp transistor QN3 when data sense is executed with the PMOS transistor QP1 kept off. Specifically, the NMOS transistor QN1 turns on when a large cell current lowers the voltage on the sense node NS2 to a certain level or below at the time of data sense.

The sense amp circuit 2 of this embodiment repeats at least two read cycles to a selected memory cell, for the purpose of reduction in power consumption, as described later. When "1" data is determined in a first read cycle, the data latch 21 turns the node N2 into "L" to turn off the transfer circuit 23 in a second read cycle, thereby controlling to prevent uselessly consumed current from flowing in bit lines.

A reset circuit 22 is provided between the sense node N1 and the ground terminal Vss. The reset circuit 22 comprises a serial circuit of an NMOS transistor QN4 having a gate controlled from the data node N1 of the data latch 21 and an NMOS transistor QN5 having a gate controlled by a reset signal GRS. In a word, the reset circuit 22 is operative to reset bit lines based on AND logic between the reset signal GRS and read data at the node N1 of the data latch 21.

The clamp transistor QN3 is operative to determine the maximum voltage (clamp voltage) on a bit line at the time of data reading, amplifying a variation in bit line voltage determined from data in a selected memory cell, and transferring it to the sense node NS2. In this embodiment, voltages applied to the gate BLC of the clamp transistor QN3 are made different from each other in two read cycles, thereby suppressing power consumption and reliably determining data.

The data latch 21 is connected to a data line via a column selection gate, not shown. Alternately, another data latch (data cache) operative to temporarily hold write/read data may be provided between the data line and the data latch 21.

Figure 3:
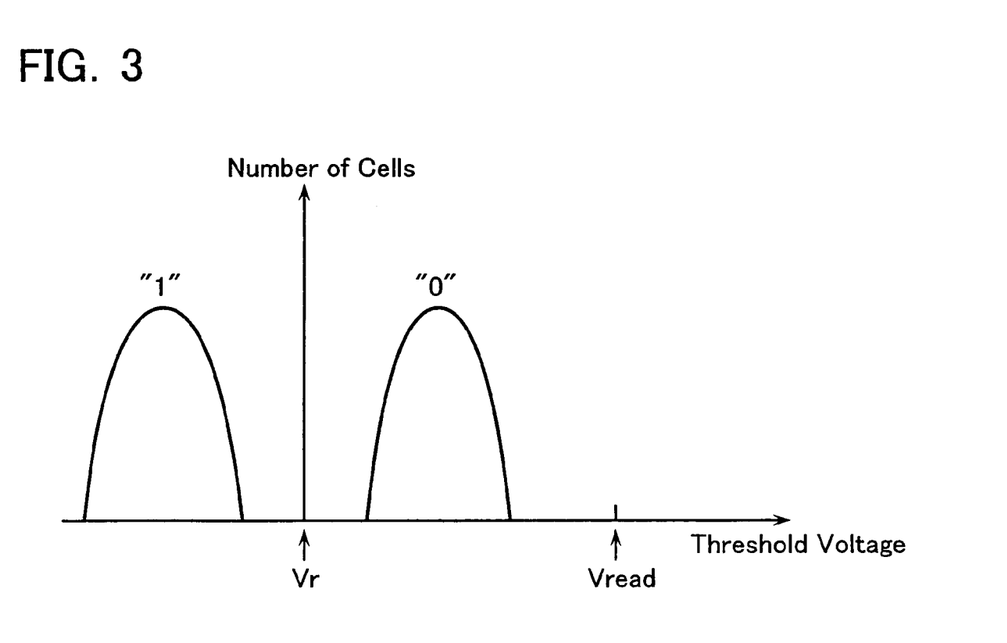
FIG. 3 shows a data threshold distribution in the same flash memory.

If the flash memory of this embodiment stores binary data, a threshold voltage distribution of data is given as shown in FIG. 3. A negative state of the threshold voltage corresponds to first logic data or "1" data (erased state), in which the conductance on selection is larger and therefore a large cell current can flow. A positive state of the threshold voltage corresponds to second logic data or "0" data, in which the conductance is smaller.

The following brief description is given to data erase and write in the NAND-type flash memory. Data erase is executed per block usually defined as a set of NAND cell units sharing a word line. A voltage of 0 V is applied to all word lines in a selected block. In addition, an erase voltage Vera (for example, 20 V) is applied to a p-type well where the memory cell array is formed therein to release electrons from inside floating gates to channels to turn all memory cells into "1" data state with a lower threshold.

The set of memory cells sharing one word line corresponds to one page or two pages. Data write (program) is executed per page. On writing, Vcc−Vt (in the case of "1" data) or Vss (in the case of "0" data) is given to an NAND cell channel via a bit line in accordance with data. In this state, a program voltage Vpgm (for example, 20 V) is applied to a word line in a selected page. In addition, a program pass voltage Vpass (a voltage sufficient to turn on memory cells regardless of data) is applied to non-selected word lines at the bit line side. In this case, in the memory cell given "0" data, electrons are injected from a channel to a floating gate due to FN tunneling. In the memory cell given "1" data, the channel potential elevates to prevent occurrences of electron injection (program inhibited).

Figure 2:
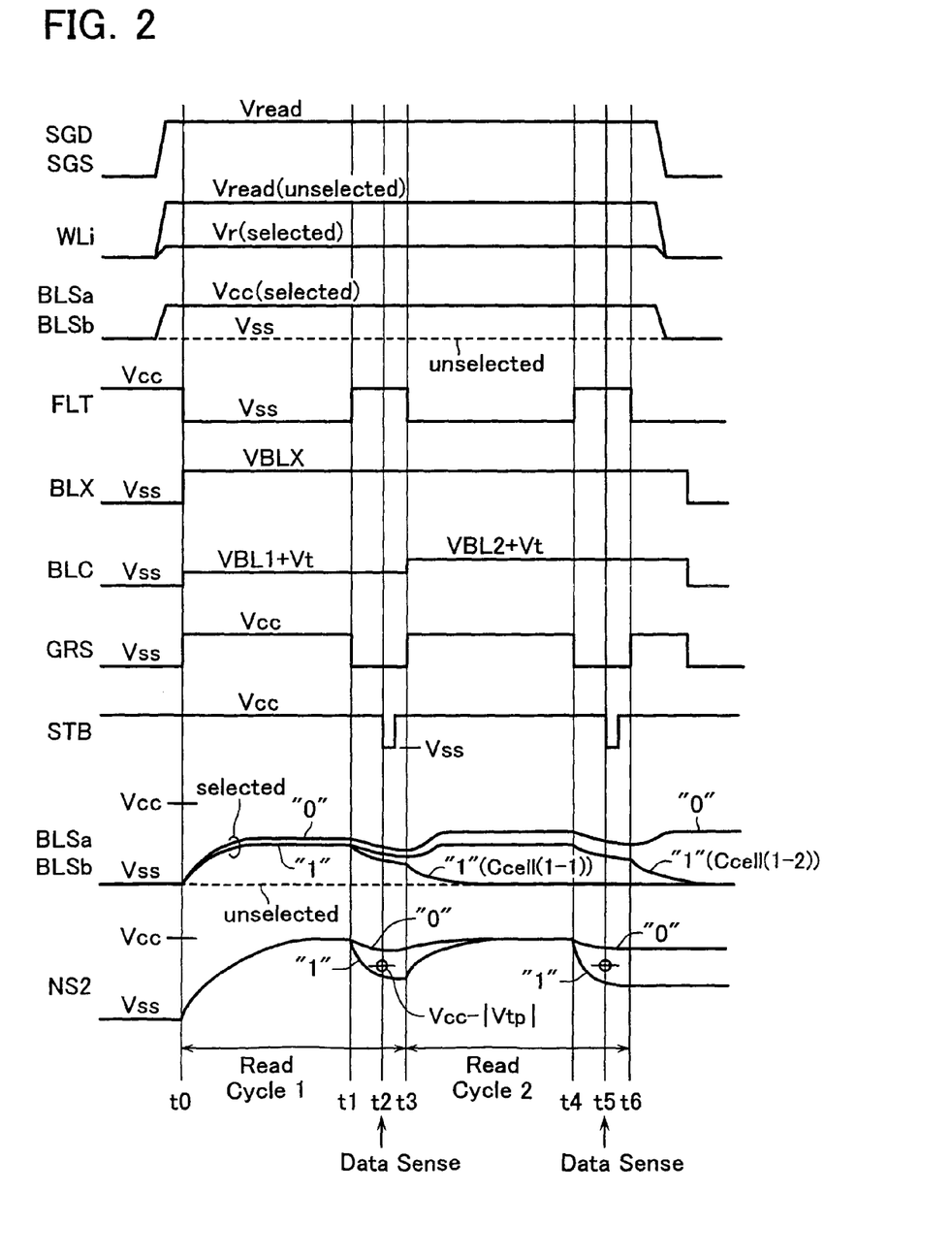
FIG. 2 is a timing chart of data reading in the same flash memory.

Data reading of this embodiment is described next with reference to a timing chart in FIG. 2. FIG. 2 shows voltages on the bit lines BLa, BLb and the sense node NS2 in a voltage range scaled up compared to other nodes. Data reading is executed per page.

As shown in FIG. 2, this embodiment has a characteristic in execution of two read cycles 1, 2 in reading data from a selected page. With respect to a cell from which data "1" is read out in the first read cycle 1, a control is performed in the second read cycle such that the sense nodes NS1, NS2 are isolated from each other not to supply read current and execute reading.

Data reading of this embodiment has another characteristic in that, in the first read cycle 1 with read current flowing in all of "1" data cells, the read current is suppressed. Specifically, the voltage applied to the gate BLC of the clamp transistor QN3 is determined, VBL1+Vt, in the first read cycle 1 and, VBL2+Vt (where VBL1<VBL2), in the second read cycle. In this case, Vt is a threshold voltage of an NMOS transistor.

Prior to reading, the data latch 21 is reset to the "0" data state (N1="L", N2="H"). During reading, a read voltage Vr (for example, 0 V) is applied to a selected word line in a selected block in the memory cell array 1. In addition, a read pass voltage Vread sufficient to turn on memory cells regardless of data is applied to non-selected word lines. A relation between these voltages and the data threshold distribution is shown in FIG. 3. The read pass voltage Vread is also applied to the selection gate lines SGD, SGS. Bit line selection signals BLSa, BLSb are given Vcc (selection) on the one and Vss (non-selection) on the other.

At timing t0, Vss is applied to the gate FLT of the current source load PMOS transistor QP1 to turn on the transistor. At the same time, a voltage VBLX lower than Vcc is applied to the gate BLX of the current source NMOS transistor QN1. The current source NMOS transistor QN1 is driven through the application of the constant gate voltage VBLX during data reading.

Also at timing t0, BLC=VBL1+Vt is applied to turn on the clamp NMOS transistor QN3. The gate bias voltage, VBL1+Vt, applied to the clamp NMOS transistor QN3 is determined lower than the bias voltage, VBL2+Vt, in the second read cycle.

During reading, RDP="H" keeps the transfer circuit 24 off. The transfer circuit 23 remains on because the data latch 21 is initialized to the state of N2="H". The control signal GRS to the reset circuit 22 becomes "H" at timing t0 though the reset circuit 22 remains off because the NMOS transistor QN4 is made off in the initialized state.

The above voltage application elevates the voltage on the selected bit line up to almost VBL1 as the clamp transistor QN3 limits the maximum of the voltage. The sense node NS2 is charged up to Vcc through the PMOS transistor QP1. The current source NMOS transistor QN1 turns on in the initial period and turns off when the voltage on the sense node NS2 elevates up to VBLX−Vt.

At timing t1, FLT="H" (=Vcc) turns off the PMOS transistor QP1 to halt supply of read current. At the same time, GRS="L" (=Vss) turns off the reset circuit 22 (while the NMOS transistor QN4 remains off in the read cycle 1).

If cell data is "0", no draw current flows in the selected bit line. Accordingly, the sense node NS2 remains at "H" level and therefore the NMOS transistor QN1 still remains off. If cell data is "1", the bit line voltage drops. This voltage drop is amplified at the clamp transistor QN3 and transmitted to the sense node NS2, lowering the voltage on the sense node NS2. When the voltage on the sense node NS2 lowers to VBLX−Vt or below, the current source NMOS transistor QN1 is turned on to supply current to prevent a large voltage drop on the sense node NS2.

At timing t2, a sense signal STB is turned to "L" (=Vss) for a short time to turn on the PMOS transistor QP4 for data sense. The sensing PMOS transistor QP5 having a threshold voltage of Vtp turns on when the sense node NS2 is at "H" level (data "0") and turns off when the sense node NS2 is at "L" level (data "1") lower than Vcc−|Vtp|. Thus, when "1" data is detected, "H" is latched on the node N1 of the data latch 21.

Thereafter, in the sense amp that reads out "1" data, the NMOS transistor QN4 in the reset circuit 22 is turned on and, when the reset signal GRS is turned to "H", the sense node NS1 keeps the state reset to Vss. In addition, under control with N2="L", the transfer circuit 23 is turned off and the sense nodes NS2, NS1 are isolated from each other. Namely, when "1" is read out in the first read cycle, read current is controlled in the second cycle not to flow in the cell.

FIG. 2 shows typical examples of "1" data, which can be determined "1" and can not be determined "1" in the first read cycle. A "1" data cell can be determined "1" in the first read cycle if it has a sufficiently large channel conductance Ccell (1-1) at the time of selection. Even "1" data may be sensed "0" in the first read cycle possibly if the channel conductance Ccell(1-2) is not sufficiently large. Therefore, the data is surely read out in the second read cycle 2.

At timing t3, FLT=Vss is applied to turn on the current source load PMOS transistor QP1 again. At the same time, the voltage applied to the clamp NMOS transistor QN3 is elevated up to VBL2+Vt, followed by supplying read current to the bit line, halting supply of read current at timing t4 and data sensing at timing t5, like in the first read cycle 1. Thus, the 1" data having not sufficiently large conductance can be sensed in the second read cycle 2 with enhanced sensitivity.

As described above, in this embodiment, data reading is executed in two read cycles and the "1"-read cell in the first cycle is not supplied with read current in the second, thereby suppressing consumed current as a whole even in the sense amp scheme of the current detection type.

In particular, as read current flows in all selected bit lines in the first read cycle, a larger consumed current flows in comparison with the second. The consumed current though can be suppressed by lowering the bias voltage, VBL1+Vt, applied to the clamp transistor QN3. In addition, the floating of the ground potential Vss can be suppressed and accordingly the risk of misreading can be reduced.

In the second read cycle, the bias voltage applied to the clamp transistor QN3 is elevated to feed a larger read current to a "1" data cell to achieve higher sensitivity and reliable data sense.

The sense amp circuit of this embodiment is of the current detection type and capable of data sensing faster than the sense amp circuit of the voltage detection type particularly in the case of a mass-storage flash memory with a larger bit line capacitance.

Figure 4:
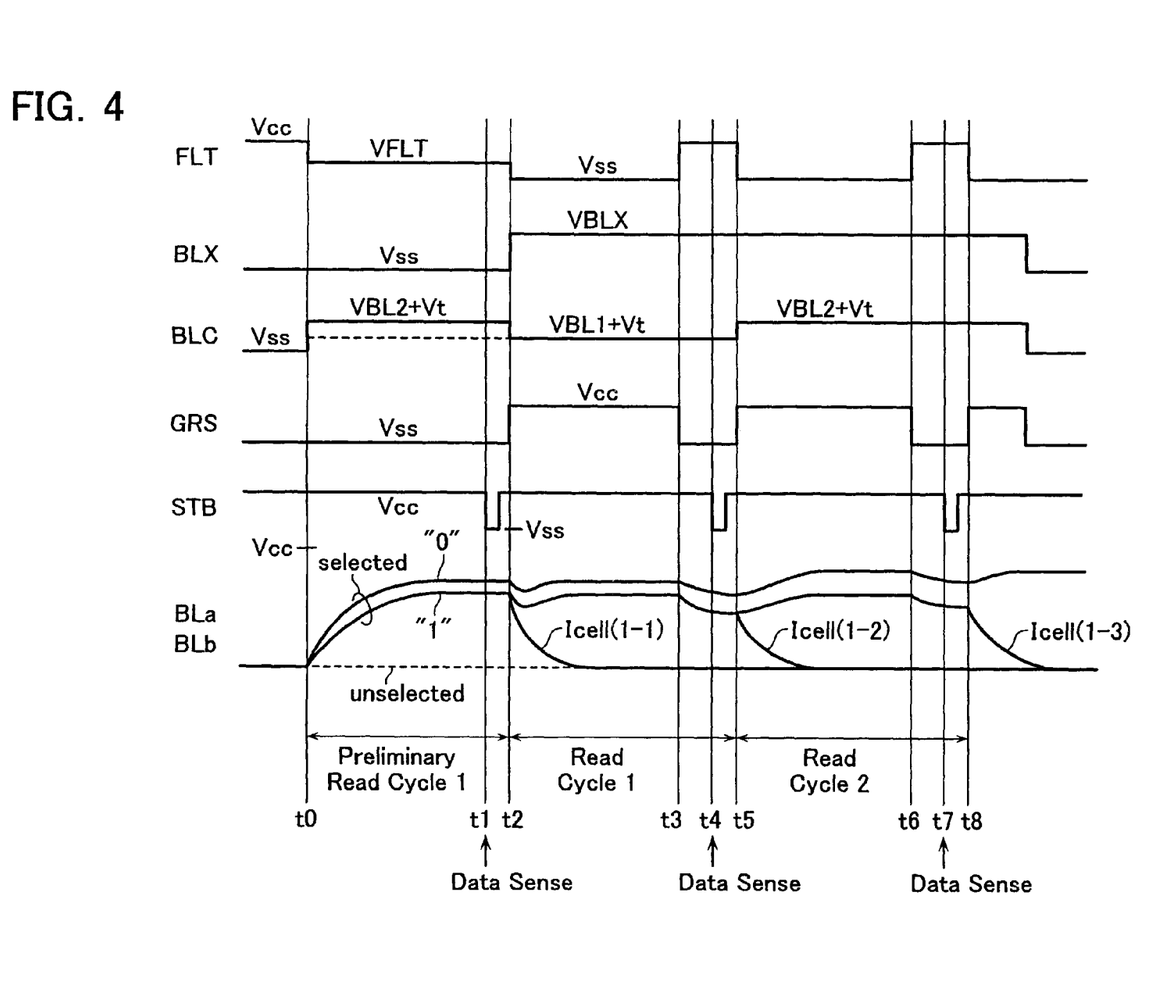
FIG. 4 is a timing chart of another example of data reading.

FIG. 4 shows another example of data reading using the same sense amp circuit 2. The voltages applied to the memory cell array are same as those in the preceding data reading. Three typical examples of variations in voltage on the selected bit line are shown about a "1" data cell, with their channel conductance at the time of selection having a relation of Ccell(1-1)>Ccell(1-2)>Ccell(1-3). In this data reading, a preliminary read cycle is provided prior to two read cycles 1 and 2 to further reduce the consumed current.

In the preliminary read cycle between timing t0-t2, the current source load NMOS transistor QN1 remains off and only the current source load PMOS transistor QP1 is employed. The voltage VFLT applied to the gate FLT is determined to make the PMOS transistor QP1 turn on in the vicinity of the threshold voltage to supply a smaller current. The gate BLC of the clamp NMOS transistor QN3 is given VBL2+Vt (or VBL1+Vt).

While supplying such the feeble current in the selected bit line, STB="L" is applied at timing t1 for data sense. As a result, the bit line voltage is amplified and transferred to the sense node NS2. Thus, the cell with a sufficiently low threshold or the "1" data cell with the channel conductance of Ccell(1-1) can be discriminated from the "0" data cell.

When "1" data is detected, the sense node NS1 is reset to the "L" level state in the following operation. In addition, the sense nodes NS1 and NS2 are isolated from each other such that read current can not flow in the corresponding bit line like in the preceding example of operation. In this preliminary reading, read current is reduced. Accordingly, "1" data may be detected "0" at a high possibility. Nevertheless, what is surely "1" data can be detected. Therefore, subsequent read current can be reduced effectively.

The read cycle 1 between timing t2-t5 and the read cycle 2 between subsequent timing t5-t8 are same as those in the preceding example of reading. Also in this case, the voltage, VBL1+Vt, applied to the clamp transistor QN3 in the read cycle 1 is controlled lower than that, VBL2+Vt, in the read cycle 2. As a result, "1" data with the channel conductance Ccell(1-2) is detected in the read cycle 1, and "1" data with the channel conductance Ccell(1-3) is detected in the read cycle 2.

Such the data sensing allows "1" data to be discriminated within a certain range in one page through the preliminary reading with the reduced current. Thereafter, a decrease occurs in the number of "1"-data-read cells in which a large read current flows. Therefore, a further reduction occurs in power consumption as a whole.

Figure 5:
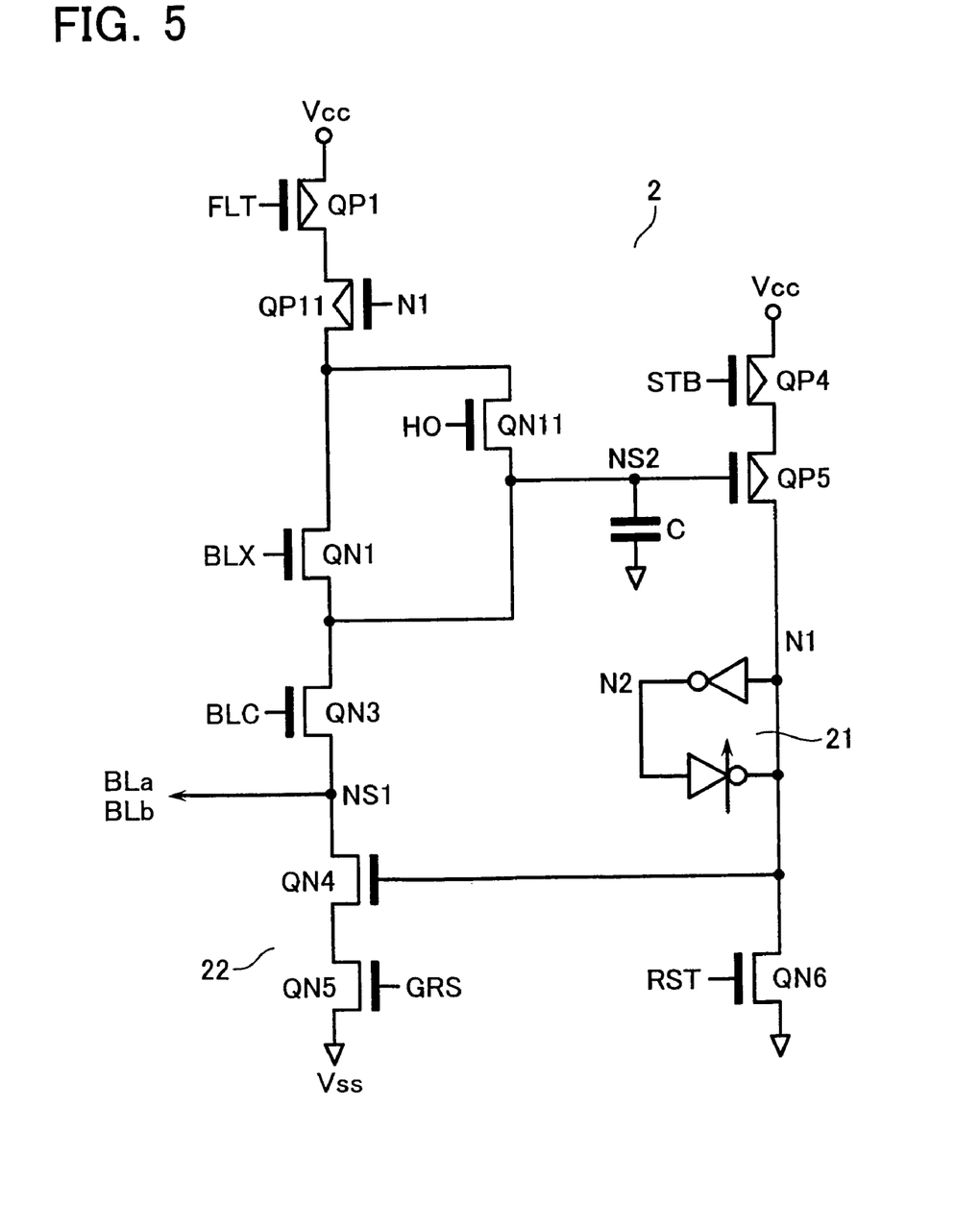
FIG. 5 shows a configuration of a sense amp circuit according to another embodiment.

FIG. 5 shows a configuration of a sense amp circuit 2 according to a second embodiment applicable to the NAND-type flash memory similar to the above embodiment, in which the same parts are denoted with the same reference numerals to omit the detailed description thereof.

In this sense amp circuit 2, the current source loads or the PMOS transistor QP1 and the NMOS transistor QN1 are serially connected to the clamp NMOS transistor QN3. Arranged between the PMOS transistor QP1 and the NMOS transistor QN1 is a switching PMOS transistor QP11 having a gate controlled from the data node N1 of the data latch 21.

Similar to the preceding embodiment, the dada latch 21 is reset to N1="L" in the initial state so that the PMOS transistor QP11 remains on. The PMOS transistor QP11 is operative to isolate the current source PMOS transistor QP1 depending on read data.

Between the drain of the PMOS transistor QP11 and the sense node NS2, a switching NMOS transistor QN11 is provided. The sense node N2 is connected to the drain of the clamp NMOS transistor QN3.

Figure 6:
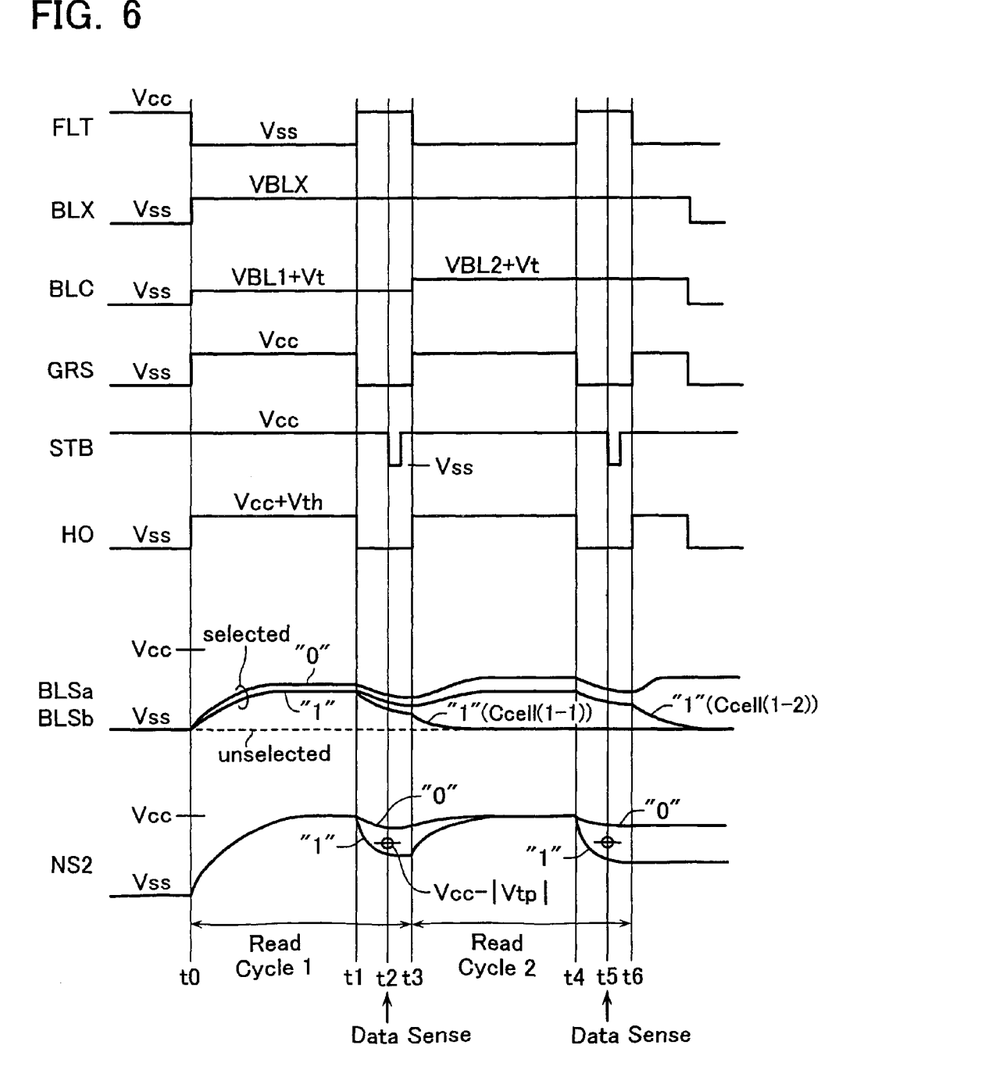
FIG. 6 is a timing chart of data reading at the same sense amp circuit.

FIG. 6 shows a timing chart of data reading using the sense amp circuit 2, corresponding to FIG. 2. Similar to the preceding embodiment, at least two read cycles 1, 2 are determined and different control voltages, VBL1+Vt and VBL2+Vt (where VBL1<VBL2), are applied to the clamp transistor QN3 in these read cycles 1, 2.

Specifically, at timing t0, FLT=Vss is applied to turn on the current source PMOS transistor QP1 and BLX=VBLX (<Vcc) is applied to turn on the current source NMOS transistor QN1. In a word, two current source load transistors QP1 and QN1 turn on at the same time. The current source NMOS transistor QN1 is driven with a constant gate voltage VBLX and operative to limit the bit line current during data reading.

Also at timing t0, BLC=VBL1+Vt is applied to turn on the clamp NMOS transistor QN3. The gate bias voltage, VBL1+Vt, applied to the clamp NMOS transistor QN3 is determined lower than the bias voltage, VBL2+Vt, in the second read cycle.

In the initial state, the data latch 21 is initialized to the state of N1="L" to turn on the PMOS transistor QP11. The control signal GRS to the reset circuit 22 becomes "H" at timing t0 though the NMOS transistor QN4 remains off in the initial state and the reset circuit 22 remains off.

Also at timing t0, "H" (=Vcc+Vt) is applied to the gate HO to turn on the NMOS transistor QN11.

The above voltage application charges the sense node NS2 up to Vcc through the PMOS transistor QP1. The current source NMOS transistor QN11 serves as a substantial current source to the bit line to charge the selected bit line with a limited current. The bit line voltage elevates up to almost VBL1 because the clamp transistor QN3 clamps the maximum thereof.

At timing t1, FLT="H" (=Vcc) is applied to turn off the PMOS transistor QP1 and HO="L" is applied to turn off the NMOS transistor QN11. As a result, the sense node NS2 is isolated from the power source and connected to the clamp transistor QN3. At the same time, GRS="L" (=Vss) is applied to turn off the reset circuit 22 (while the NMOS transistor QN4 remains off in the first read cycle 1).

If cell data is "0", no draw current flows in the selected bit line. Accordingly, the sense node NS2 remains at "H" level and therefore the NMOS transistor QN1 still remains off. If cell data is "1", the bit line voltage drops. This voltage drop is amplified at the clamp transistor QN3 and transmitted to the sense node NS2, lowering the voltage on the sense node NS2.

At timing t2, the sense signal STB is turned to "L" (=Vss) for a short time to turn on the PMOS transistor QP4 for data sense. The sensing PMOS transistor QP5 having a threshold voltage of Vtp turns on when the sense node NS2 is at "H" level (data "0") and turns off when the sense node NS2 is at "L" level (data "1") lower than Vcc−|Vtp|. Thus, when "1" data is detected, "H" is latched on the node N1 of the data latch 21.

Thereafter, in the sense amp that reads out "1" data, the NMOS transistor QN4 in the reset circuit 22 is turned on and, when the reset signal GRS is turned to "H", the sense node NS1 keeps the state reset to Vss. In addition, under control with N1="H", the PMOS transistor QP11 is turned off to isolate the PMOS transistor QP1. Namely, when "1" is read out in the first read cycle 1, read current is controlled in the second cycle not to flow.

FIG. 6 shows typical examples of "1" data, which can be determined "1" and can not be determined "1" in the first read cycle, like in the case of FIG. 2. A "1" data cell can be determined "1" in the first read cycle if it has a sufficiently large channel conductance Ccell(1-1) at the time of selection. Even "1" data may be sensed "0" in the first read cycle possibly if the channel conductance Ccell(1-2) is not sufficiently large. Therefore, the data is surely read out in the second read cycle 2.

At timing t3, FLT=Vss is applied to turn on the current source PMOS transistor QP1 again. At the same time, the voltage applied to the clamp NMOS transistor QN3 is elevated up to VBL2+Vt, followed by charging the sense node N2 and supplying the bit line current, halting the operation at timing t4 and data sensing at timing t5, like in the first read cycle 1. Thus, the "1" data having not sufficiently large conductance can be sensed in the second read cycle 2 with enhanced sensitivity.

Also in this embodiment, fast data reading can be executed with suppressed power consumption like in the preceding embodiment. Different from the preceding embodiment, in this embodiment, at the time of supplying read current to the bit line, the NMOS transistor QN1 controlled with application of the gate voltage VBLX lower than Vcc limits the drain voltage on the clamp transistor QN3 and also limits the bit line current. Accordingly, this embodiment is possible to achieve a larger reduction in power consumption than the preceding embodiment.

A configuration of a sense amp circuit 2 according to a third embodiment of the present invention is described next with reference to FIGS. 7 and 8. In this embodiment, a time period for data sense (hereinafter referred to as a sense time), after the timing to halt supply of read current until the timing to start data sense, is determined longer in the first read cycle 1 than in the second read cycle 2. This is different from the above embodiments.

Figure 7:
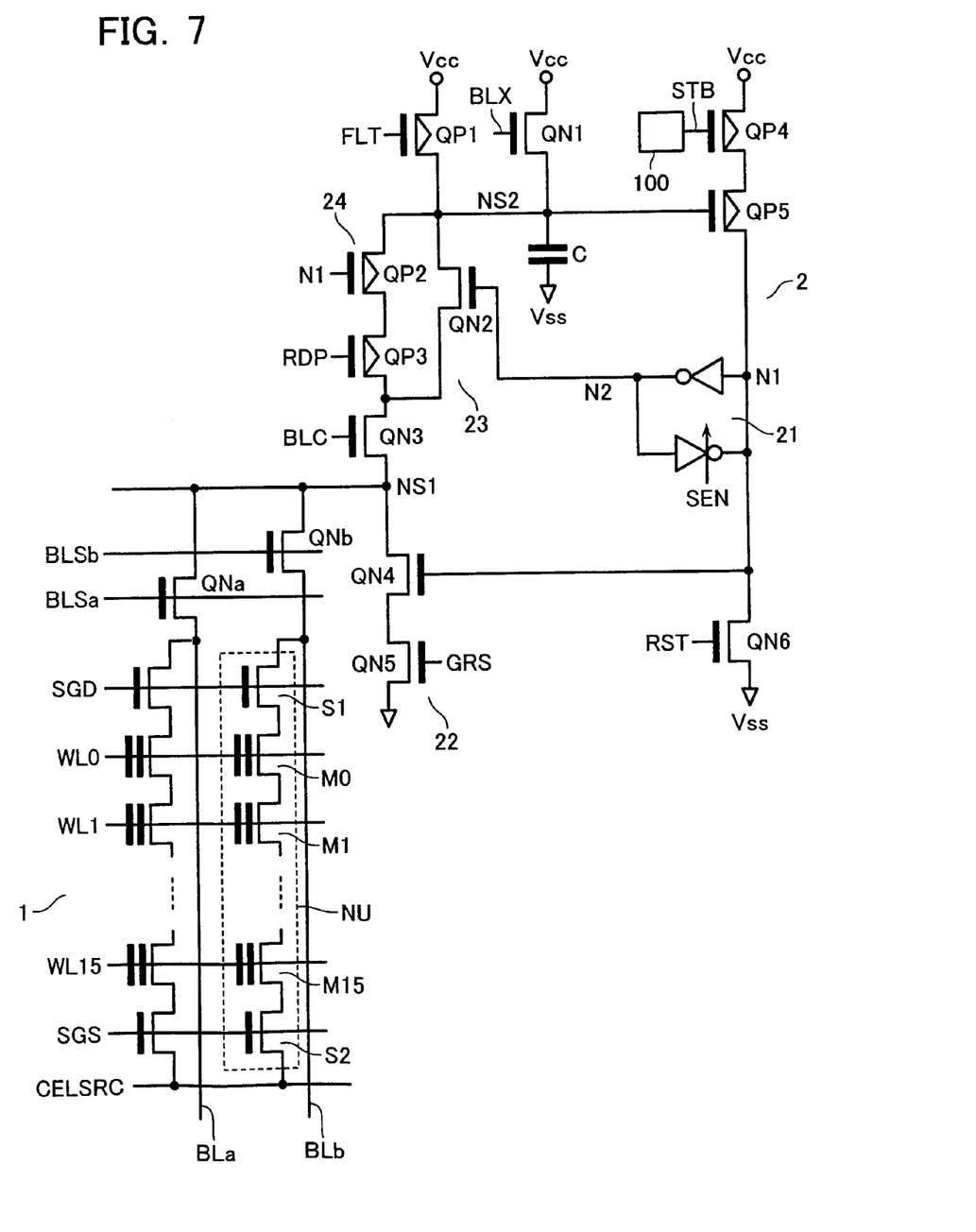
FIG. 7 shows a configuration of a sense amp circuit according to another embodiment.
Figure 8:
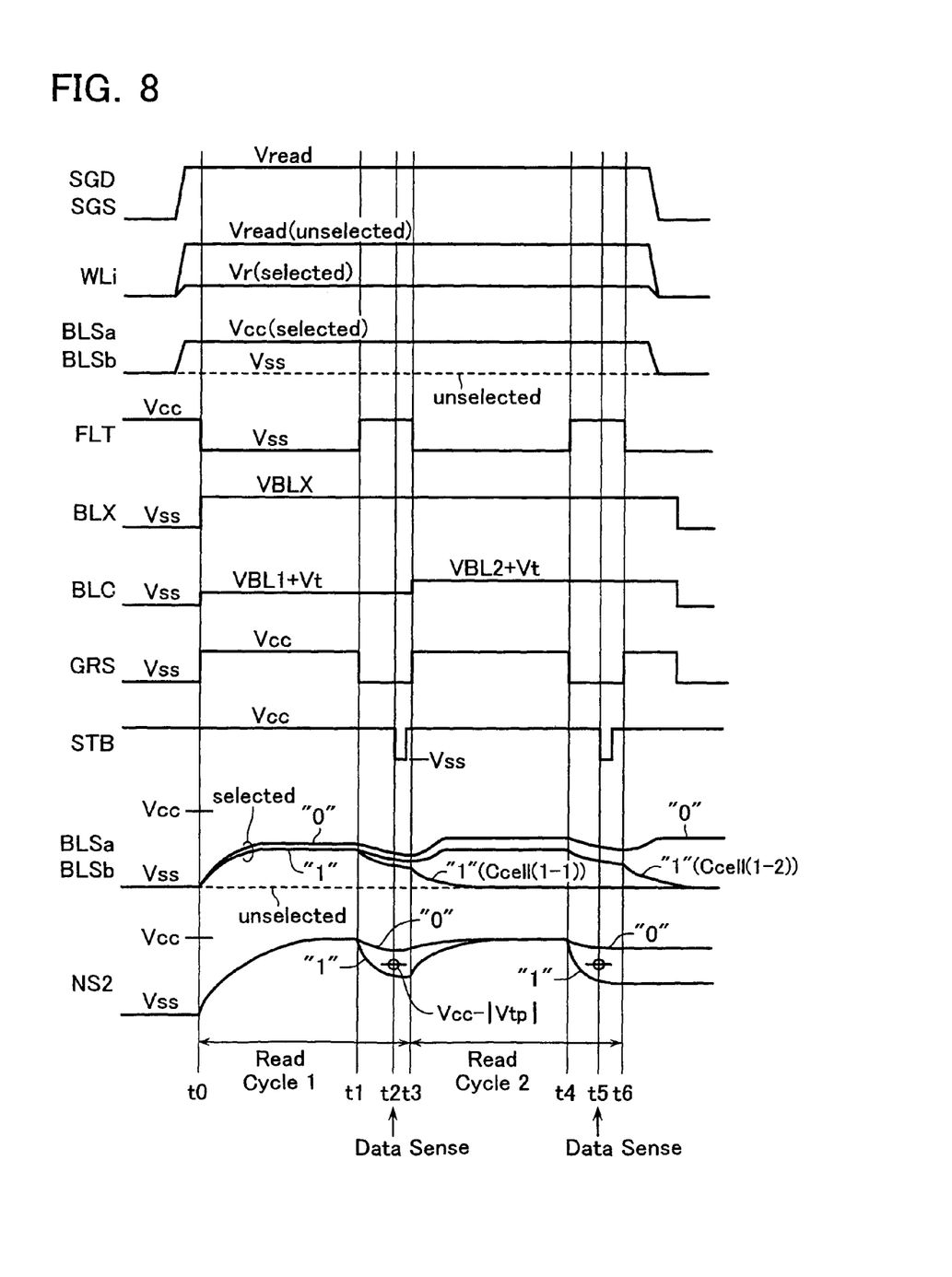
FIG. 8 is a timing chart of data reading at the same sense amp circuit.

FIG. 7 shows the configuration of the sense amp circuit 2 according to this embodiment. As shown in FIG. 7, the sense amp circuit 2 is provided with a controller 100 operative to control the sense signal STB fed to the gate of the PMOS transistor QP4. The controller 100 turns the sense signal STB to "L" for a short time after the sense time Ts elapses after the signal to the gate FLT of the current source load PMOS transistor QP1 is turned to "H". In this case, the sense time is (t2−t1) in the first read cycle 1 is determined longer than the sense time Ts (=t5−t4) in the second read cycle 2 as shown in FIG. 8.

Such the determination of the sense time Ts in the first read cycle 1 longer than that in the second read cycle 2 can enhance the sensitivity to the cell current. Namely, in the first read cycle 1, a memory cell targeted to read at the sense amp circuit 2 and other memory cells having the same threshold ("1" or "0") as that of the targeted memory cell are present. In this case, the magnitude of the cell current in the presence of relatively many memory cells with lower threshold voltages differs as a whole from that in the presence of relatively many memory cells with higher threshold voltages among the above other memory cells. When the cell current varies, the influence from the parasitic resistance changes the degree of the common source line CELSRC in the NAND cell floating from the ground potential to change the current characteristic of the cell current.

Therefore, elongation of the sense time Ts in the first read cycle 1 can increase the cell current to enhance the sensitivity even if the threshold voltages of other memory cells are low. In the second read cycle, detection of memory cells with larger cell current has been completed and only memory cells with somewhat smaller cell current should have been left. Accordingly, even if the sense time Ts is shortened, the potential on the common source line CELSRC is kept at near 0 V (the degree of floating from the ground potential is small) to retain high sensitivity. The sense amp circuit 2 of FIG. 1 is exemplified for description in FIG. 7 though the third embodiment is also applicable to the sense amp circuit 2 of FIG. 5, needless to say.

Figure 9:
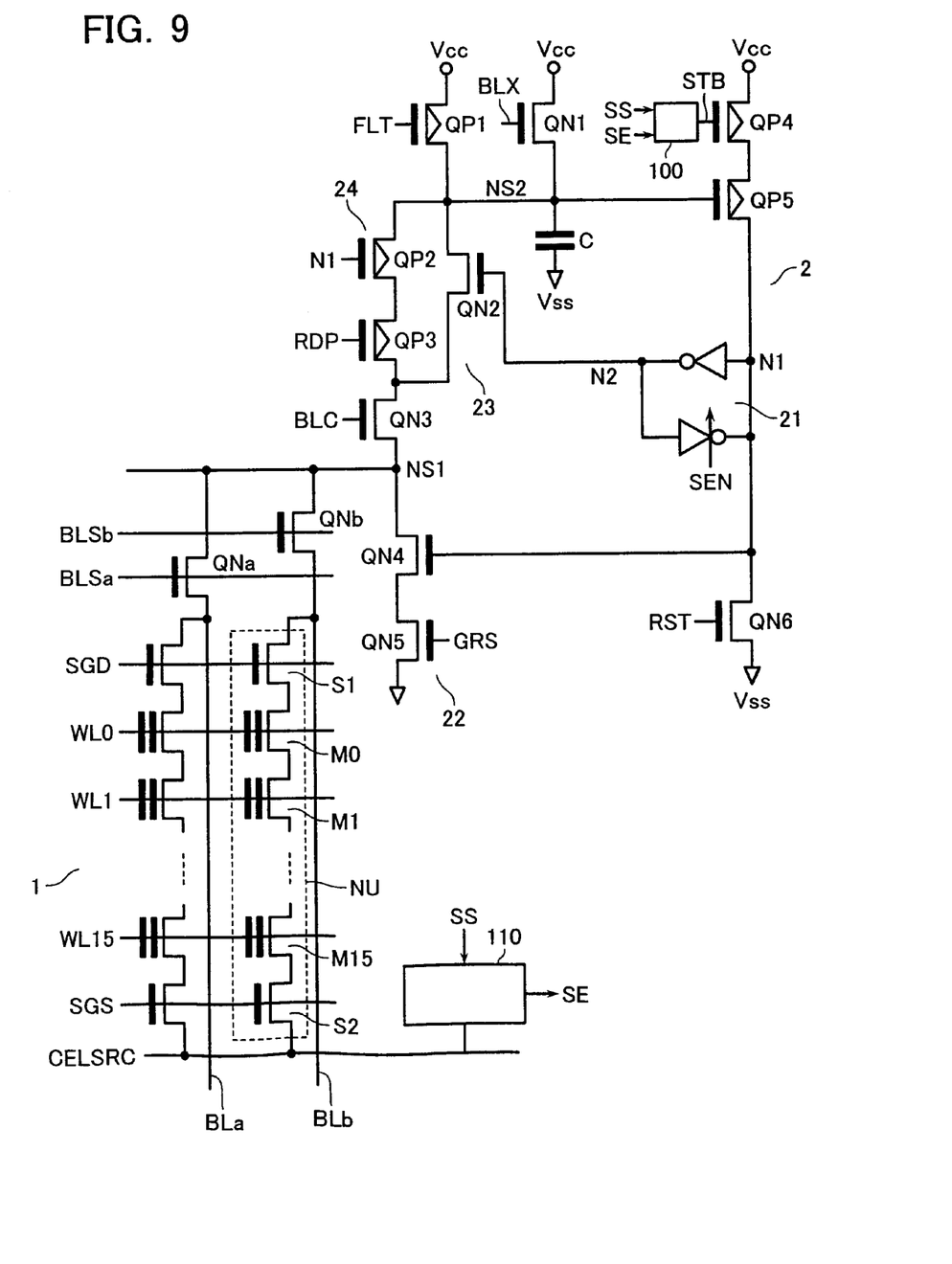
FIG. 9 shows a configuration of a sense amp circuit according to another embodiment.

A configuration of a sense amp circuit 2 according to a fourth embodiment of the present invention is described next with reference to FIGS. 9 and 10. This embodiment is in common with the third embodiment in that the sense time Ts in the first read cycle 1 may differ from that in the second read cycle 2. It is different, however, from the third embodiment in that the potential on the common source line CELSRC is detected actually to change the sense time Ts in the first read cycle 1 based on the detected value.

The sense amp circuit 2 is provided with a sense time controller 110. The sense time controller 110 begins operation on receipt of a data sense start signal SS indicative of the start (timing t1, t4) of the sense time Ts. It is operative to change the output timing of a sense end signal SE indicative of the end (timing t2, t5) of the sense time Ts depending on the level of the potential on the common source line CELSRC. The sense end signal SE is fed to the controller 100. On receipt of the sense end signal SE after the receipt of the sense start signal SS, the controller 100 turns the sense signal STB to "L" for a short time to begin data sensing.

Figure 10:
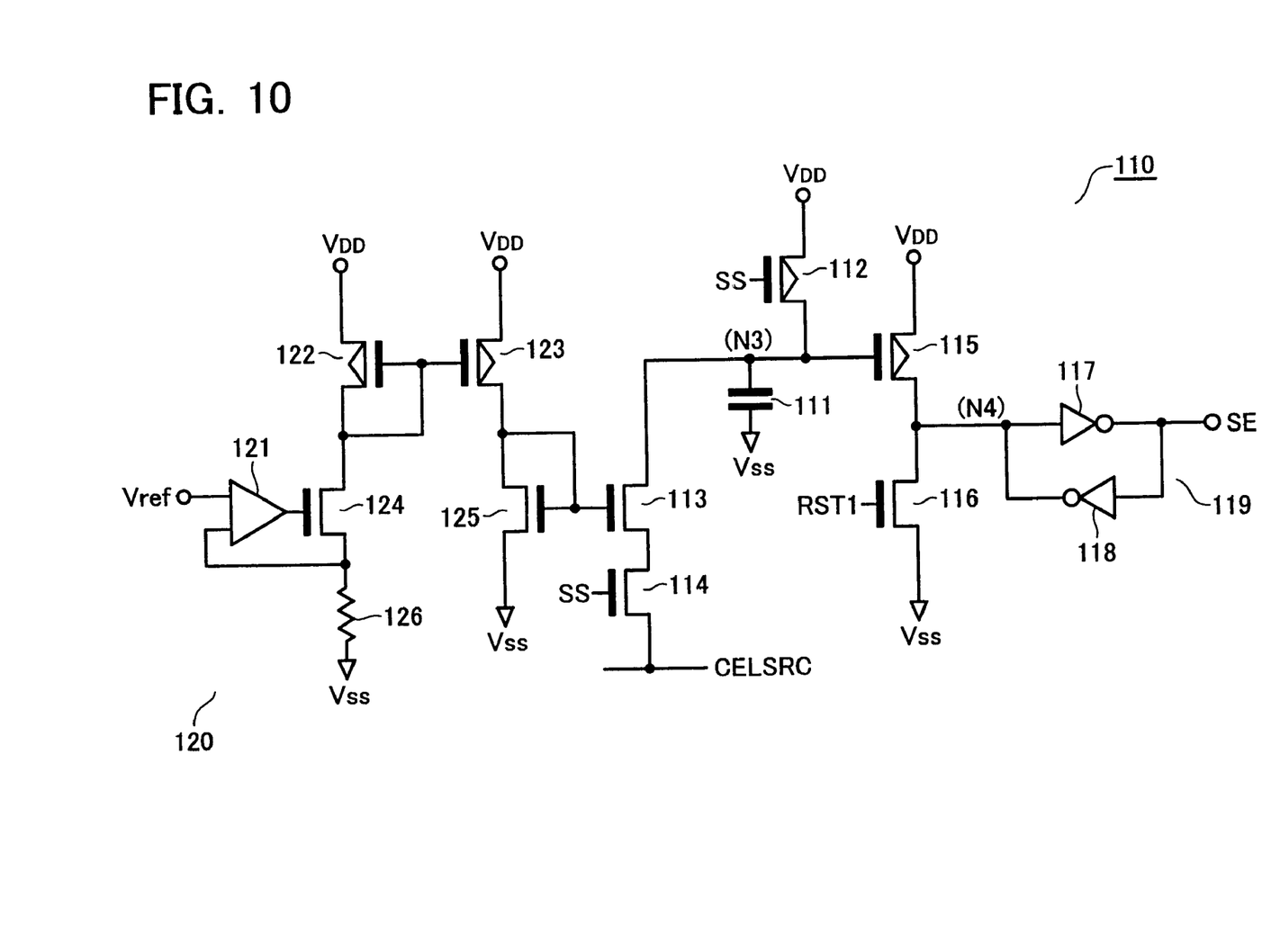
FIG. 10 is a circuit diagram showing an example of a specific configuration of a sense time controller 110 of FIG. 9.

FIG. 10 shows an example of a specific configuration of the sense time controller 110. The sense time controller 110 includes, for example, a capacitor 111, a charge PMOS transistor 112, a current control NMOS transistor 113, a discharge NMOS transistor 114, a switching PMOS transistor 115, a reset NMOS transistor 116, a latch circuit 119, and a current mirror circuit 120.

The capacitor 111 has one end connected to a node N3 and the other end connected to the ground potential Vss. The charge PMOS transistor 112 has one end connected to a supply voltage VDD and the other end connected to the node N3 and turns on when the sense start signal SS is "L" to charge the capacitor 111 up to a voltage of VDD across both ends.

The current control NMOS transistor 113 and the discharge NMOS transistor 114 are serially connected between the node N3 and the common source line CELSRC to configure a discharge path from the capacitor 111 together. The discharge NMOS transistor 114 is made conductive when the sense start signal SS becomes "H" (that is, the charge PMOS transistor is made non-conductive) to start discharging from the capacitor 111.

The current control NMOS transistor 113 has a gate connected to the current mirror circuit 120 to turn the discharge current flowing through drain-source into a constant current.

The switching PMOS transistor 115 has a gate connected to the node N3, a source connected to the supply voltage VDD and a drain connected to a node N4. The reset NMOS transistor 116 is connected between the node N4 and the ground potential Vss. The reset NMOS transistor 116 is operative to turn on to reset the node N4 to "L" or the ground potential Vss when a reset signal RST1 becomes "H".

The latch circuit 119 includes inverters 117 and 118 each having an input terminal connected to an output terminal of the other to configure a flip-flop circuit.

The input terminal of the inverter 117 is connected to the node N4 and the input terminal of the inverter 118 is connected to the output terminal from which the sense end signal SE is output. The latch circuit 119 is designed to set the node N4 at "L" and the output terminal at "H" at the timing to feed the sense start signal SS in the initial time of operation.

The current mirror circuit 120 includes a comparator 121, PMOS transistors 122 and 123, NMOS transistors 124 and 125, and a resistor 126.

The PMOS transistor 122 is diode-connected and serially connected to the NMOS transistor 124 and the resistor 126 to configure a first current path between the supply voltage VDD and the ground terminal. The PMOS transistor 123 has a gate connected to the gate of the PMOS transistor 122 to configure a second current path together with the diode-connected NMOS transistor 125. The NMOS transistor 125 has a gate connected to the gate of the current control NMOS transistor 113. The comparator 121 is operative to compare a reference voltage Vref with the terminal voltage on the resistor 126 at an end close to the transistor 124 to change the output voltage. Therefore, the current mirror circuit 120 is operative to feed a constant current in the current control NMOS transistor 113. The constant current is determined from the reference voltage Vref, the resistance of the resistor 126, and the degree of the ground terminal floating from 0 V.

The following description is given to operation of the sense time controller 110. The sense start signal SS remains "L" before the beginning of data sense, thereby making the charge PMOS transistor 112 conductive to charge the capacitor 111 up to a voltage of VDD across both ends.

When supply of read current is halted at timing t1, the sense start signal SS turns from "L" into "H" to make the charge PMOS transistor 112 non-conductive and the discharge NMOS transistor 114 conductive. As a result, charges on the capacitor 111 are discharged through the discharge path of the transistors 113 and 114 to lower the potential on the node N3 gradually from VDD. During the discharge, the current mirror circuit 120 controls the discharge current flowing through the current control NMOS transistor 113 to exhibit a constant current value.

When the potential on the node N3 reaches the threshold voltage Vt15 of the switching PMOS transistor 115 or below, the switching PMOS transistor 115 turns from non-conductive into conductive. As a result, the potential on the node N4 is switched to the supply voltage VDD and the sense end signal SE is switched from "H" to "L". The switching timing of the sense end signal SE varies depending on the level of the potential on the common source line CELSRC. In the case of the configuration shown in FIG. 10, the time after the sense start signal SS is output until the sense end signal SE is switched, or the sense time Ts, can be determined from (Capacitance C of the capacitor 111)×(Threshold voltage VT of the switching PMOS transistor 115)/(Current value I of the discharge current).

Accordingly, the larger the degree of the ground potential containing the common source line CELSRC floating from 0 V, the smaller the current value I becomes and therefore the longer the sense time Ts becomes. On the other hand, when the potential on the common source line CELSRC is closer to 0 V, the current value I becomes larger and accordingly the sense time Ts becomes shorter. Thus, the sense amp circuit 2 of this embodiment is possible to set the sense time Ts longer in the first read cycle 1 only in the presence of a possibility of erroneous detection depending on situations. Therefore, it is possible to improve the sensitivity and shorten the read time compatibly.

The above embodiments describe the NAND-type flash memory. The invention is also applicable to other flash memories of the NOR-type and the AND-type. More generally, it is applicable to various semiconductor memory devices having memory cells of the current draw type, or memory cells of which data is determined from a difference in conductance.

What is claimed is:

1. A semiconductor memory device, comprising:
a memory cell array including bit lines connected to memory cells operative to store first logic data and second logic data smaller in cell current than said first logic data; and
a sense amp circuit having a clamp transistor operative to clamp a bit line voltage, said sense amp circuit being operative to detect data in a selected memory cell via said clamp transistor and said bit line,
said sense amp circuit including
a current source load provided to supply read current to said bit line through said clamp transistor,
a transfer circuit arranged between said current source load and said clamp transistor and on/off-controlled based on read data,
a sense transistor having a gate connected to a connection node between said current source load and said transfer circuit, and
a data latch operative to hold data detected at said sense transistor,
wherein said clamp transistor comprises a clamp NMOS transistor,
wherein said sense transistor comprises a PMOS transistor having a source connected via a switching element to a power supply terminal and a drain connected to said data latch,
wherein said current source load includes
a current source PMOS transistor on-driven for a certain time period after the beginning in each read cycle to supply read current, and
a current source NMOS transistor given a certain gate voltage during each read cycle to supply current corresponding to a voltage drop on said sense node while said current source PMOS transistor is turned off for data sense,
wherein said sense amp circuit is operative to read data from said selected memory cell in at least the two of first and second read cycles while a control voltage is applied to a gate of said clamp NMOS transistor, and is controlled to supply no read current in said second read cycle to a selected memory cell from which said first logic data is detected in said first read cycle,
wherein a certain voltage is applied to word lines in said memory cell array during said first and second read cycles,
wherein a control voltage applied to said clamp NMOS transistor in said first read cycle is determined lower than that in said second read cycle, and
wherein said transfer circuit is off-controlled based on data held in said data latch in said second read cycle after said first logic data is detected in said first read cycle.

2. The semiconductor memory device according to claim 1, wherein data sense in each read cycle is executed when said current source PMOS transistor is turned off and then said switching element is turned on.

3. The semiconductor memory device according to claim 1, wherein preliminary read for data sense is executed while said current source PMOS transistor and said clamp NMOS transistor are kept on before said first read cycle.

4. The semiconductor memory device according to claim 1, wherein said sense amp circuit further comprises a reset transistor having a drain connected to a source of said clamp NMOS transistor, and said reset transistor is turned on when said second read cycle is performed to a selected memory cell from which said first logic data is detected in said first read cycle.

* * * * *